United States Patent
Honjo et al.

(10) Patent No.: US 6,996,901 B2
(45) Date of Patent: Feb. 14, 2006

(54) PRODUCTION METHOD OF WIRED CIRCUIT BOARD

(75) Inventors: Mitsuru Honjo, Osaka (JP); Toshiki Naito, Osaka (JP)

(73) Assignee: Nitto Denko Corporation, Osaka (JP)

( * ) Notice: Subject to any disclaimer, the term of this patent is extended or adjusted under 35 U.S.C. 154(b) by 0 days.

(21) Appl. No.: 10/992,009

(22) Filed: Nov. 19, 2004

(65) Prior Publication Data

US 2005/0115066 A1 Jun. 2, 2005

(30) Foreign Application Priority Data

Nov. 21, 2003 (JP) .............................. 2003-391862

(51) Int. Cl.
*H05K 3/02* (2006.01)
(52) U.S. Cl. .............................. 29/847; 29/825; 29/846; 427/96.1; 427/96.4
(58) Field of Classification Search ................ 29/825, 29/846, 847; 427/96.1, 96.4
See application file for complete search history.

(56) References Cited

U.S. PATENT DOCUMENTS

| | | | |
|---|---|---|---|
| 3,907,621 A * | 9/1975 | Polichette et al. ............ 216/17 |
| 4,532,152 A * | 7/1985 | Elarde ......................... 216/13 |
| 6,242,079 B1 * | 6/2001 | Mikado et al. ............. 428/209 |
| 6,410,858 B1 * | 6/2002 | Sasaki et al. ............... 174/255 |
| 6,591,495 B1 * | 7/2003 | Hirose et al. ................. 29/846 |

FOREIGN PATENT DOCUMENTS

JP 2003-37137 2/2003

* cited by examiner

*Primary Examiner*—Carl J. Arbes
(74) *Attorney, Agent, or Firm*—Jean C. Edwards, Esq.; Akerman Senterfitt

(57) ABSTRACT

A production method of a wired circuit board can prevent corrosion of a first thin metal film inwardly of a conductor layer, due to the forming of an undercut portion caused by a skirt portion of a plating resist. A first thin metal film is formed on an insulating base layer. A plating resist is formed in a reversal pattern to a wiring circuit pattern on the first thin metal film, and a conductor layer is formed in the wiring circuit pattern on the first thin metal film exposed from the plating resist. Thereafter, the plating resist is removed and, then, a second thin metal film is formed on the conductor layer and first thin metal film. Thereafter, the second thin metal film and then all portions of the first thin metal layer, except portions thereof where the conductor layer is formed, are removed.

2 Claims, 2 Drawing Sheets

(a)

(b)

(c)

(d)

PRODUCTION METHOD OF WIRED CIRCUIT BOARD

BACKGROUND OF THE INVENTION

1. Field of the Invention

The present invention relates to a production method of a wired circuit board and, more particularly, to a production method of a flexible wired circuit board.

2. Description of the Prior Art

In the production method of the flexible wired circuit board, the subtractive process and the additive process are known as the patterning process of a wiring circuit pattern. Of these patterning processes, the additive process is advantageous to the forming of a high-definition pattern required for a liquid crystal display part of electronic equipment such as a mobile phone.

As described for example by JP Laid-open (Unexamined) Patent Publication No. 2003-37137, the additive process is known as a process of forming a conductor pattern on an insulating substrate. Specifically, according to this additive process, a first conductor layer of a thin metal film is formed on an entire surface of an insulating substrate, then the first conductor layer is covered with a plating resist so that a conductor pattern is exposed from the plating resist, then a second conductor is formed on an surface of the first conductor layer not covered with the plating resist, then the plating resist is removed, and finally a portion of the first conductor layer on which the second conductor layer was not formed is removed by etching, to thereby form the conductor pattern.

However, the additive process described above causes the plating resist 22 formed on the first conductor 21 on the insulating substrate 26 to form, at a bottom thereof contacting with the first conductor 21, a skirt portion 23 that becomes wider toward the lower side gradually, as shown in FIG. 2(a). This produces the result that when the second conductor 24 is formed on a surface of the first conductor 21 not covered with the plating resist 22, as shown in FIG. 2(b), and thereafter the plating resist 22 is removed, as shown in FIG. 2(c), an undercut portion 25 that becomes narrower toward the lower side gradually is formed at a bottom of the second conductor 24 contacting with the first conductor 21 due to the skirt portion 23. This in turn produces the result that when the first conductor 21 is removed by etching, the first conductor 21 on the bottom of the second conductor 24 is etched to be largely scooped out inwardly of the second conductor 24 due to the undercut portion 25, as shown in FIG. 2(d). This produces the disadvantage that the adhesiveness between the insulating substrate 26 and the first conductor 21 is reduced significantly so that the conductor pattern comprising the first conductor 21 and the second conductor 24 is stripped from the insulating substrate 26.

SUMMARY OF THE INVENTION

It is an object of the invention to provide a production method of a wired circuit board that can prevent corrosion of the first thin metal film inwardly of the conductor layer, which is due to the forming of the undercut portion caused by the skirt portion of the plating resist, to prevent the peeling of a wiring circuit pattern.

The present invention provides a production method of a wired circuit board comprising the process of preparing an insulating layer; the process of forming a first thin metal film on the insulating layer; the process of forming a plating resist in a reversal pattern to a wiring circuit pattern on the first thin metal film; the process of forming a conductor layer in the wiring circuit pattern on the first thin metal film exposed form the plating resist; the process of removing the plating resist; the process of forming a second thin metal film on the conductor layer and first thin metal film; the process of removing the second thin metal film; and the process of removing all portions of the first thin metal layer except portions thereof where the conductor layer is formed.

In the production method of the wired circuit board of the present invention, it is preferable that the conductor layer and the second thin metal film are both formed of copper.

In the production method of the wired circuit board of the present invention, even when the skirt portions are formed in the plating resist at the bottom thereof contacting with the first thin metal film, due to which the undercut portions that become narrower toward the lower side gradually are formed in the conductor layer at the bottom thereof contacting with the thin metal film, the metal used for forming the second thin metal film is filled in those undercut portions in the process of forming the second thin metal film. This can prevent the first thin metal film on the bottom of the conductor layer from being etched to be scooped out inwardly of the conductor layer due to the undercut portions in the sequent process of removing the first thin metal film. This can prevent reduction in adhesiveness between the insulating layer and the first thin metal film, and as such can effectively prevent the peeling of the wired circuit pattern comprising the first thin metal film and second thin metal film from the insulating layer.

Also, in the production method of the wired circuit board of the present invention, when both the conductor layer and the second thin metal film are formed of copper, the same metal, copper, can be filled in the undercut portions of the conductor layer formed of copper having good electrical characteristics in the process of forming the second thin metal film. This can provide the advantage of preventing reduction in electric characteristic of the wiring circuit pattern, while preventing the peeling of the wiring circuit pattern.

Figure 2:
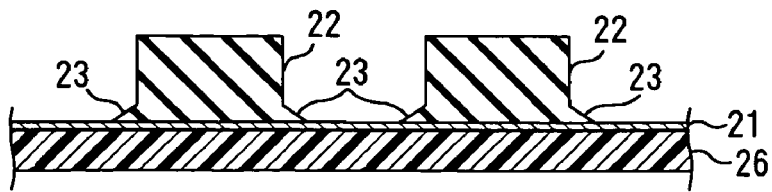
Figure 2:
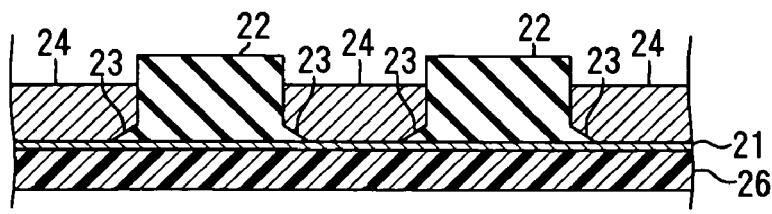
Figure 2:
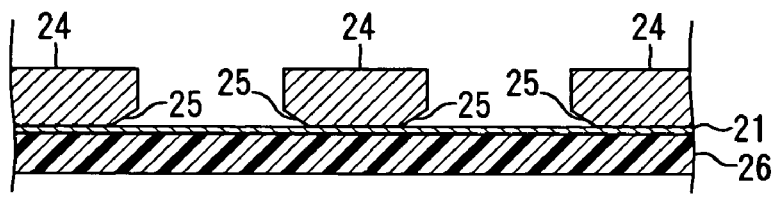
Figure 2:
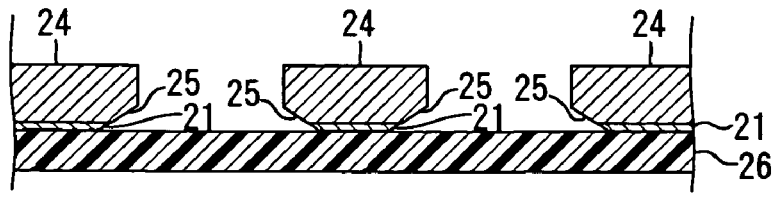

(a) shows the process of preparing an insulating base layer;

(b) shows the process of forming a first thin metal film on the insulating base layer;

(c) shows the process of forming a plating resist on the first thin metal film in a pattern reversal to a wiring circuit pattern;

(d) shows the process of forming a conductor layer on the first thin metal film exposed from the plating resist in the same pattern as the wiring circuit pattern:

(e) shows the process of removing the plating resist;

(f) shows the process of forming a second thin metal film on the conductor layer and the first thin metal film;

(g) shows the process of removing the second thin metal film;

(h) shows the process of removing the entire portion of the first thin metal film except a portion thereof where the conductor layer is formed; and (i) shows the process of forming an insulating cover layer on the insulating base layer to cover the wiring circuit pattern, FIG. 2 is a production process drawing showing a conventional production method of a flexible wired circuit board:

(a) shows the process of forming a plating resist on a first conductor layer;
(b) shows the process of forming a second conductor layer on an surface of the first conductor layer not covered with the plating resist;
(c) shows the process of removing the plating resist; and
(d) shows the process of removing a portion of the first conductor layer where the second conductor layer is not formed.

DETAILED DESCRIPTION OF THE PREFERRED EMBODIMENTS

Figure 1:
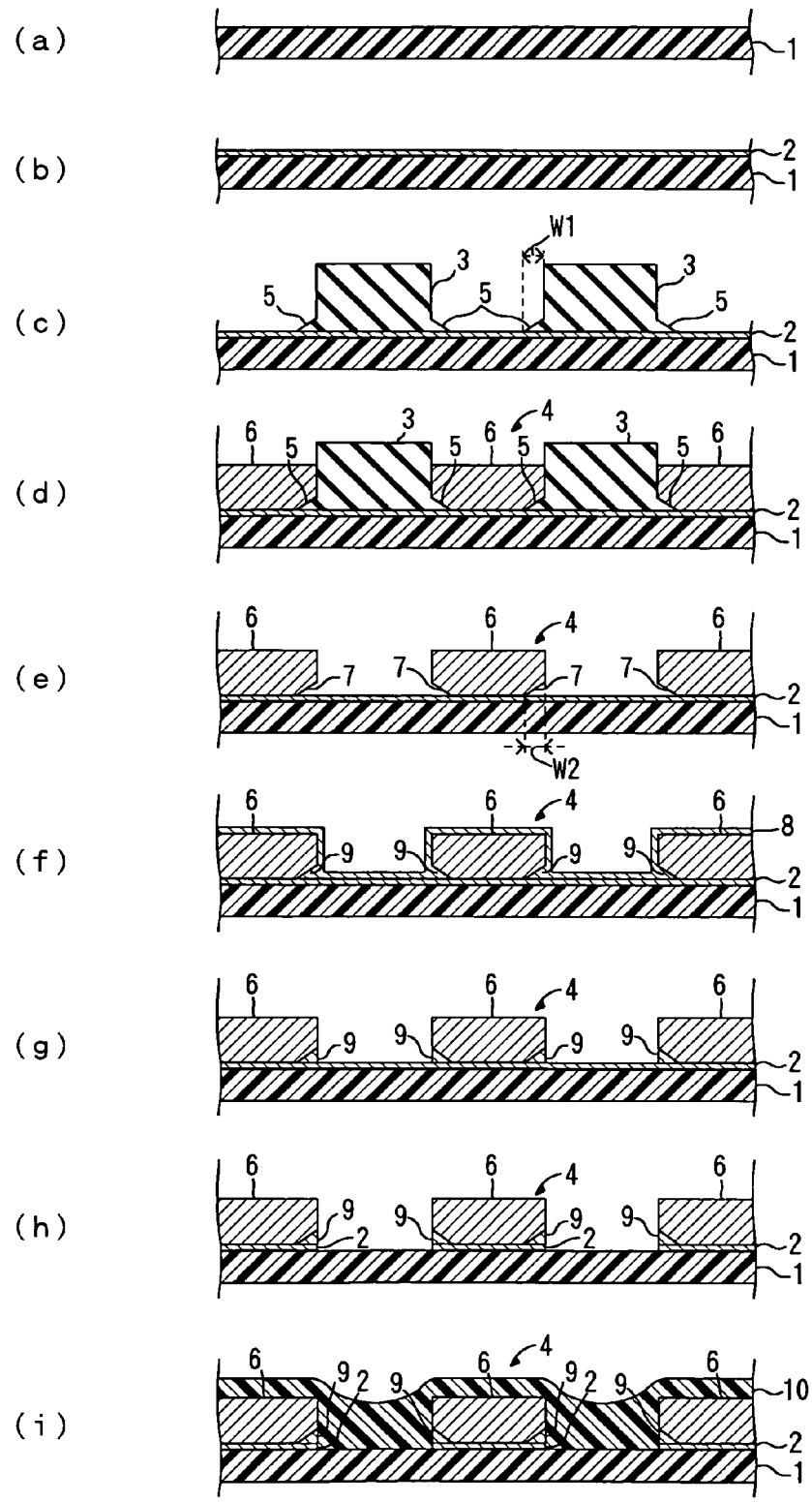
FIG. 1 is a production process drawing of a production method of a flexible wired circuit board as an embodiment of a production method of a wired circuit board of the present invention.

FIG. 1 is a production process drawing of a production method of a flexible wired circuit board as an embodiment of a production method of a wired circuit board of the present invention. Referring to FIG. 1, the production method of a flexible wired circuit board which is an embodiment of the production method of the wired circuit board of the present invention will be described.

In this method, an insulating base layer 1 is prepared, first, as shown in FIG. 1(a).

Synthetic resin films, including, for example, a polyimide resin film, a polyamideimide resin film, an acrylic resin film, a polyether nitrile resin film, a polyether sulfonic resin film, a polyethylene terephthalate resin film, a polyethylene naphthalate resin film, a polyvinyl chloride resin film, and a fluorocarbon resin film can be used as the insulating base layer 1. Preferably, the polyimide resin film is used as the first insulating layer 1.

An insulating substrate previously produced in the form of a film may be used as the insulating layer 1. Alternatively, the insulating base layer 1 produced by the method that solution of photosensitive resin is formed into a film and, then, the film is exposed to light and developed to form a predetermined pattern and then is cured may be used. The insulating base layer 1 usually has a thickness of 3 $\mu$m–100 $\mu$m, or preferably 5 $\mu$m–50 $\mu$m.

Then, a first thin metal film 2 is formed on the insulating base layer 1, as shown in FIG. 1(b).

The metals that may be preferably used for forming the first thin metal film 2 include, for example, chromium, nickel, and copper. The first thin metal film 2 is formed by using plating or a vacuum deposition method. Preferably, the first thin metal film 2 is formed by the vacuum deposition method, particularly by sputtering. To be more specific, a thin chromium film and a thin copper film are formed on the entire surface of the insulating base layer 1 in sequence by the sputtering deposition method.

The first thin metal film 2 usually has a thickness in the range of e.g. 1 nm–6 $\mu$m, or preferably 50 nm–5 $\mu$m.

A plating resist 3 is formed on the first thin metal film 2 to be in the form of a reversal pattern to the wiring circuit pattern 4, as shown in FIG. 1(c).

No particular limitation is imposed on the process of forming the plating resist 3. For instance, the plating resist 3 is formed by the process that after a dry film photoresist is laminated on the entire surface of the first thin metal film 2, the dry film photoresist is exposed to light and developed, to form the first thin metal film 2 into the resist pattern reversal to the wiring circuit pattern 4. This process causes each resist portion of the plating resist 3 thus formed to form, at each lateral side thereof in the bottom contacting with the first thin metal film 2, a skirt portion 5 having a generally triangular section that becomes wider toward the lower side gradually.

The plating resist 3 usually has a thickness of 5 $\mu$m–30 $\mu$m, or preferably 10 $\mu$m–20 $\mu$m. Also, the each skirt portion 5 usually has the width W1 of 1 $\mu$m–5 $\mu$m at a bottommost part thereof.

Thereafter, a conductor layer 6 is formed in the wiring circuit pattern 4 on the first thin metal film 2 exposed from the plating resist 3, as shown in FIG. 1(d).

The conductor layer 6 is formed of metal, such as copper, nickel, gold, solder, or alloys thereof. Copper is preferably used. Also, the conductor layer 6 is formed by plating, such as electroless plating or electrolytic plating. The electrolytic plating is preferably used. To be more specific, the conductor layer 6 formed of copper is formed by electrolytic copper plating in the form of the wiring circuit pattern 4 on the first thin metal film 2 in an surface thereof where the plating resist 3 is not formed. In the electrolytic copper plating, for example a copper sulfate solution, a copper pyrophosphate solution, or the like is used as a plating solution.

The conductor layer 6 usually has a thickness of 3 $\mu$m–20 $\mu$m, or preferably 5 $\mu$m–15 $\mu$m, and a width of 15 $\mu$m–500 $\mu$m, or preferably 20 $\mu$m–300 $\mu$m. Also, the conductor layers 6 are usually spaced from each other at a distance of 15 $\mu$m–200 $\mu$m, or preferably 20 $\mu$m–300 $\mu$m.

Then, the plating resist 3 is removed, as shown in FIG. 1(e). The plating resist 3 is removed for example by a known etching process, such as a chemical etching (wet etching) using an alkaline solution, such as sodium hydrate, as an etching solution, or by peeling.

When the plating resist 3 is removed, undercut portions 7 having a generally triangular section that become narrower toward the lower side gradually are formed in the conductor layer 6 at lateral sides thereof in the bottom where the skirt portions 5 of the plating resist 3 were formed. The each undercut portion 7 usually has a width W2 of 1–5 $\mu$m at a bottommost part thereof.

Then, a second thin metal film 8 is formed on the conductor layer 6 and the first thin metal film 2, as shown in FIG. 1(f).

The same metals as those used for forming the conductor layer 6 may be used for forming the second thin metal film 8. Preferably, copper is used for forming the second thin metal film 8. Using copper for forming both the conductor layer 6 and the second thin metal film 8 can provide the advantage that when the second thin metal film 8 is formed on the conductor layer 6, the same metal, copper, can be filled in the undercut portions 7 of the conductor layer 6 formed of copper having good electrical characteristics, to form metal filling portions 9. This can provide the advantage of preventing reduction in electric characteristic of the wiring circuit pattern 4, while preventing the peeling of the wiring circuit pattern 4.

The second thin metal film 8 is formed by plating, such as electroless plating or electrolytic plating. The electrolytic plating is preferably used. To be more specific, the second thin metal film 8 formed of copper is formed on the entire surface of the conductor layer 6 and the entire surface of the first thin metal film 2 exposed from the conductor layer 6 by the electrolytic copper plating. In the electrolytic copper plating, for example a copper sulfate solution or a copper pyrophosphate solution, or a via-fill plating solution, is used as a plating solution.

When the second thin metal film 8 is formed in this process, the metal used to form the second thin metal film 8 is filled in the undercut portions 7 of the conductor layer 6, to form the metal filling portions 9.

The second thin metal film 8 usually has a thickness of 0.3 μm–10 μm, or preferably 1 μm–5 μm.

Then, the second thin metal film 8 is removed, as shown in FIG. 1(g). The second thin metal film 8 is removed by a known etching method such as the chemical etching (wet etching) using e.g. an iron chloride solution or the like as the etching solution. In this etching process, all portions of the second thin metal film 8, except the metal filling portions 9, are removed, so that the metal filling portions 9 remain.

If the second thin metal film 8 is formed of copper and the first thin metal film 2 is formed by laminating a thin chromium film and a thin copper film in sequence, then the thin copper film of the first thin metal film 2 exposed from the conductor layer 6 can also be removed together with the second thin metal layer 8 in the process of removing the second thin metal film 8 by etching so that only the thin chromium film remains as the first thin metal film 2.

Thereafter, all portions of the first thin metal film 2, except the portions thereof where the conductor layer 6 is formed, are removed to thereby produce a flexible wired circuit board, as shown in FIG. 1(h).

If the first thin metal film 2 is formed for example by a thin chromium film, then the first thin metal film 2 exposed from the conductor layer 6 can be removed by a known etching method such as the chemical etching (wet etching) using a potassium ferrocyanate solution or the like as the etching solution.

After this process, the wiring circuit pattern 4 comprising the first thin metal film 2 and the conductor layer 6 is formed.

Then, if necessary, an insulating cover layer 10 is formed on the insulating base layer 1, to cover the wiring circuit pattern 4, as shown in FIG. 1(i).

The same synthetic resin as that for the insulating base layer 1 is used for the insulating cover layer 10. Preferably, polyimide resin is used for the insulating cover layer 10. The insulating cover layer 10 is formed for example by coating a photosensitive resin solution on the insulating base layer 1 including the wiring circuit pattern 4, to form a film, then exposing the film to light and developing it, to form the film into a predetermined pattern, and then curing the film thus patterned.

The insulating cover layer 10 usually has a thickness of 2 μm–50 μm, or preferably 5 μm–30 μm.

According to this production method of the flexible wired circuit board, even when the skirt portions 7 are formed in the plating resist 3 at the bottom thereof contacting with the first thin metal film 2 in the process of forming the plating resist 3, due to which the undercut portions 7 are formed in the conductor layer 6 at the bottom thereof contacting with the first thin metal film 2, the metal used for forming the second thin metal film 8 is filled in those undercut portions 7 to form the metal filling portions 9 in the process of forming the second thin metal film 8. This can prevent the first thin metal film 2 on the bottom of the conductor layer 6 from being etched to be scooped out inwardly of the conductor layer 6 due to the undercut portions 7 in the sequent process of removing the first thin metal film 2. This can prevent reduction in adhesiveness between the insulating base layer 1 and the first thin metal film 2, and as such can effectively prevent the peeling of the wiring circuit pattern 4 comprising the first thin metal film 2 and second thin metal film 8 from the insulating base layer 1.

Thus, this production method of the flexible wired circuit board is advantageous to the forming of a high-definition wiring circuit pattern required for a liquid crystal display part of electronic equipment such as a mobile phone and therefore can effectively be used for producing the flexible wired circuit board requiring the forming of such a high-definition wiring circuit pattern.

It is to be noted that for example, in the case where the first thin metal film 2 and the second thin metal film 8 are formed of the same metal, the removal of the second thin metal film 8 shown in FIG. 1(g) and the removal of the first thin metal film 2 shown in FIG. 1(h) can be carried out simultaneously without being carried out separately.

Although the flexible wired circuit board having the structure wherein the wiring circuit pattern 4 and the insulating cover layer 10 are formed on the insulating base layer 1 has been described above, it may have another structure such as the structure wherein the insulating base layer 1 is formed on a metal supporting layer, and the wired circuit pattern 4 and the insulating cover layer 10 are formed on that insulating base layer 1.

Industrially, the production method described above can use a known process, such as a roll-to-roll process, for producing a flexible wired circuit board.

EXAMPLES

While in the following, the present invention will be described in further detail with reference to Example and Comparative Example.

Example 1

An insulating base layer of a polyimide resin film having a thickness of 25 μm was prepared (Cf. FIG. 1(a)). Then, a thin chromium film having a thickness of 20 nm and a thin copper film having a thickness of 200 nm were formed on the insulating base layer in sequence by the sputtering deposition process, to form the first thin metal film (Cf FIG. 1(b)). Then, after a dry film photoresist was laminated on the entire surface of the first thin metal film, the dry film photoresist was exposed to light and developed, to form the first thin metal film into a resist pattern reversal to the wiring circuit pattern and having a thickness of 15 μm (Cf FIG. 1(c)). This process caused each resist portion of the plating resist thus formed to form, at each lateral side thereof in the bottom contacting with the first thin metal film, a skirt portion having a generally triangular section that becomes wider toward the lower side gradually.

Thereafter, a conductor layer having a thickness of 10 μm was formed in the wiring circuit pattern on the first thin metal film exposed from the plating resist by the electrolytic copper plating using a copper sulfate solution (Cf FIG. 1(d)). The conductor layer was formed to have a thickness of 25 μm, and the conductor layers were spaced from each other at a distance of 25 μm. Thereafter, the plating resist was removed by a chemical etching using a sodium hydrate solution (Cf. FIG. 1(e)). When the plating resist was removed, undercut portions having a generally triangular section that become narrower toward the lower side gradually were formed in the conductor layer at lateral sides thereof in the bottom where the skirt portions of the plating resist were formed, and the each undercut portion had a width of 2 μm at a bottommost part thereof.

Then, a second thin metal film having a thickness of 2 μm was formed on the entire surface of the conductor layer and the entire surface of the first thin metal film exposed from the conductor layer by the electrolytic copper plating using the copper sulfate solution (Cf. FIG. 1(f)). When the second thin metal film was formed in this process, the copper used to form the second thin metal film was filled in the undercut portions of the conductor layer, to form metal filling portions.

Then, the second thin metal film was removed by the chemical etching using an iron chloride solution (Cf. FIG. 1(g)). In this etching process, all portions of the second thin metal film, except the metal filling portions, were removed, so that the metal filling portions remain.

Thereafter, the first thin metal film was removed by the chemical etching using a potassium ferrocyanate solution to thereby produce a flexible wired circuit board (Cf. FIG. 1(h)).

In the flexible wired circuit board obtained, the undercut portions of the conductor layer in the bottom thereof contacting with the first thin metal film was filled with copper to form the metal filling portions. The peel strength of the wiring circuit pattern was 2.0 g per a strip of wiring pattern.

Comparative Example 1

Except that the process of forming the second thin metal film and the process of removing the same were omitted, the same processes as those of Example 1 were taken to produce a flexible wired circuit board.

In the flexible wired circuit board thus produced, the undercut portions of the conductor layer in the bottom thereof contacting with the first thin metal film caused the first thin metal film on the bottom of the conductor layer to be etched to be largely scooped out inwardly of the conductor layer. The peel strength of the wiring circuit pattern was 0.5 g per a strip of wiring pattern.

While the illustrative embodiments of the present invention are provided in the above description, such is for illustrative purpose only and it is not to be construed restrictively. Modification and variation of the present invention that will be obvious to those skilled in the art is to be covered by the following claims.

What is claimed is:

1. A production method of a wired circuit board comprising:
   preparing an insulating layer;
   forming a first thin metal film on the insulating layer;
   forming a plating resist in a reversal pattern to a wiring circuit pattern on the first thin metal film;
   forming a conductor layer in the wiring circuit pattern on the first thin metal film exposed form the plating resist;
   removing the plating resist;
   forming a second thin metal film on the conductor layer and first thin metal film;
   removing the second thin metal film; and
   removing all portions of the first thin metal layer except portions thereof where the conductor layer is formed.

2. The production method of the wired circuit board according to claim 1, wherein the conductor layer and the second thin metal film are both formed of copper.

* * * * *